(12) United States Patent
Xi

(10) Patent No.: US 9,640,278 B1
(45) Date of Patent: May 2, 2017

(54) TESTABILITY/MANUFACTURING METHOD TO ADJUST OUTPUT SKEW TIMING

(71) Applicant: Integrated Device Technology, Inc., San Jose, CA (US)

(72) Inventor: Xiaoming Xi, San Jose, CA (US)

(73) Assignee: INTEGRATED DEVICE TECHNOLOGY, INC., San Jose, CA (US)

(*) Notice: Subject to any disclaimer, the term of this patent is extended or adjusted under 35 U.S.C. 154(b) by 0 days.

(21) Appl. No.: 14/964,953

(22) Filed: Dec. 10, 2015

(51) Int. Cl.
G11C 11/34 (2006.01)
G11C 29/02 (2006.01)
G11C 11/4076 (2006.01)
G11C 11/4096 (2006.01)
G11C 29/52 (2006.01)

(52) U.S. Cl.
CPC ........ G11C 29/023 (2013.01); G11C 11/4076 (2013.01); G11C 11/4096 (2013.01); G11C 29/52 (2013.01)

(58) Field of Classification Search
None
See application file for complete search history.

(56) References Cited

U.S. PATENT DOCUMENTS

| | | | |
|---|---|---|---|
| 6,658,604 B1 | 12/2003 | Corbin et al. | 714/700 |
| 6,876,239 B2 * | 4/2005 | Bell | G11C 7/22 327/158 |
| 7,234,099 B2 * | 6/2007 | Gower | G06F 11/1044 361/748 |
| 7,555,668 B2 | 6/2009 | Murtagh et al. | 713/503 |
| 7,671,579 B1 * | 3/2010 | Chong | G01R 31/3016 324/76.35 |
| 8,488,399 B2 | 7/2013 | Yu et al. | 365/194 |
| RE44,632 E | 12/2013 | Oh et al. | 365/233.1 |
| 8,631,267 B2 | 1/2014 | Johnson | 713/401 |
| 8,941,430 B2 | 1/2015 | Palmer et al. | 327/263 |
| 2005/0065747 A1 * | 3/2005 | Premy | G01R 31/3167 702/120 |
| 2007/0171760 A1 * | 7/2007 | Gomm | G11C 7/22 365/189.15 |
| 2014/0003551 A1 * | 1/2014 | Yang | H03L 7/0814 375/295 |
| 2015/0269018 A1 * | 9/2015 | Ellis | G06F 11/2635 714/42 |
| 2016/0042773 A1 * | 2/2016 | Cho | G11C 7/02 365/189.07 |
| 2016/0111139 A1 * | 4/2016 | Choksey | G11C 11/4063 365/189.02 |

* cited by examiner

Primary Examiner — Son Dinh
Assistant Examiner — Sultana Begum
(74) Attorney, Agent, or Firm — Christopher P. Maiorana PC.

(57) ABSTRACT

An apparatus includes an output driver circuit and a trimming circuit. The output driver circuit may be configured to (i) receive an input signal and a first control signal and (ii) generate an output signal. The output signal may be a delayed version of the input signal. A length of delay between the input signal and the output signal is determined in response to the first control signal. The trimming circuit may be configured to generate the first control signal in response to a second control signal. The trimming circuit is generally enabled to vary a value of the first control signal to minimize a phase difference between the output signal and an output clock signal.

20 Claims, 7 Drawing Sheets

TESTABILITY/MANUFACTURING METHOD TO ADJUST OUTPUT SKEW TIMING

FIELD OF THE INVENTION

The invention relates to automated electronic testing generally and, more particularly, to a method and/or apparatus for implementing a design for testability (DFT)/design for manufacturing (DFM) method to adjust output skew timing.

BACKGROUND OF THE INVENTION

Automated test equipment (ATE) is used to test individual integrated circuits for compliance with predetermined specifications during manufacture. One of the most accurate testers available on the market has an overall AC accuracy of +/−55 picoseconds (ps). However, the existing testers are still not accurate enough to meet tSkew specs of +/−50 ps desired by certain manufacturers during DDR4 registered clock driver (RCD) tSkew testing.

It would be desirable to implement a design for testability (DFT)/design for manufacturing (DFM) method to adjust output skew timing.

SUMMARY OF THE INVENTION

The invention concerns an apparatus including an output driver circuit and a trimming circuit. The output driver circuit may be configured to (i) receive an input signal and a first control signal and (ii) generate an output signal. The output signal may be a delayed version of the input signal. A length of delay between the input signal and the output signal is determined in response to the first control signal. The trimming circuit may be configured to generate the first control signal in response to a second control signal. The trimming circuit is generally enabled to vary a value of the first control signal to minimize a phase difference between the output signal and an output clock signal.

BRIEF DESCRIPTION OF THE DRAWINGS

Embodiments of the invention will be apparent from the following detailed description and the appended claims and drawings in which:

DETAILED DESCRIPTION OF THE PREFERRED EMBODIMENTS

Embodiments of the invention include providing a method to adjust output skew timing that may (i) comply with design for testability (DFT) criteria, (ii) comply with design for manufacturing (DFM) guidelines, (iii) provide higher accuracy than existing automated test equipment, (ii) allow adjustment of output skew timing within one gate delay, (iii) be performed serially or in parallel on multiple IC outputs, (iv) provide accurate adjustment of output skew timing during device testing regardless of the accuracy of automated test equipment used, and/or (v) be implemented within an integrated circuit.

Figure 1:
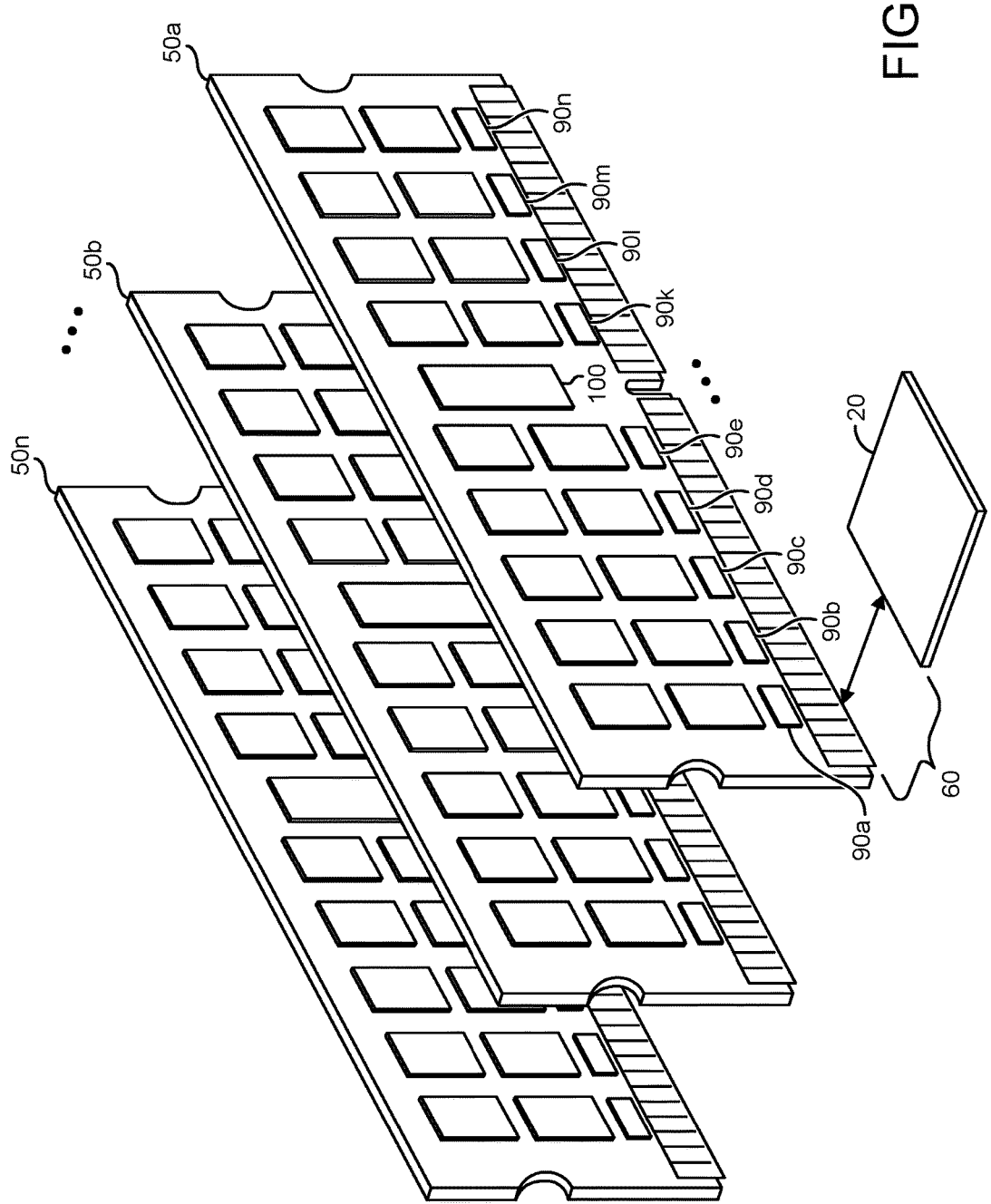
FIG. 1 is a diagram illustrating memory system in which an embodiment of the invention is implemented.

Referring to FIG. 1, a diagram of a memory system is shown including a registered clock driver chip in accordance with an embodiment of the invention. In an example, the memory system may include circuits 50a-50n that may be implemented as memory modules (or boards). For example, the memory modules 50a-50n may be implemented as double data rate fourth generation (DDR4) synchronous dynamic random access memory (SDRAM) modules. The memory modules 50a-50n may comprise a block (or circuit) 100 and various other blocks, circuits, pins, connectors and/or traces. The circuit 100 may be implemented as a registered clock driver (RCD) in accordance with an embodiment of the invention. In an example, the RCD circuit 100 may be implemented as a DDR4 RCD circuit. The type, arrangement and/or number of components of the memory modules 50a-50n may be varied to meet the design criteria of a particular implementation. For example, when the memory modules 50a-50n implement DDR4 load-reduced dual in-line memory modules (LRDIMM), the memory modules 50a-50n may include a number of blocks (or circuits) 90a-90n. The circuits 90a-90n may be configured as data buffers.

The memory modules 50a-50n are shown connected to a block (or circuit) 20. The circuit 20 may be a memory controller. The circuit 20 may be located in another device, such as a computing engine. Various connectors/pins/traces 60 may be implemented to connect the memory modules 50a-50n to the memory controller 20. In some embodiments, the connectors/pins/traces 60 may be a 288-pin configuration. In an example, the memory controller 20 may be a component of a computer motherboard. In another example, the memory controller 20 may be a component of a microprocessor. In yet another example, the memory controller 20 may be a component of a central processing unit (CPU).

In an example, some of the connectors/pins/traces 60 may be part of the memory modules 50a-50n and some of the connectors/pins/traces 60 may be part of the motherboard and/or memory controller 20. The memory modules 50a-50n may be connected to a computer motherboard (e.g., by pins, traces and/or connectors 60) to transfer data between components of a computing device and the memory modules 50a-50n. In an example, the memory controller 20 may be implemented on a Northbridge of a motherboard and/or as a component of a microprocessor (e.g., an Intel CPU, an AMD CPU, an ARM CPU, etc.). The implementation of the memory controller 20 may be varied according to the design criteria of a particular implementation.

In various embodiments, the memory modules 50a-50n may be DDR4 SDRAM modules. The DDR4 SDRAM memory modules 50a-50n may have a memory module density of 512 gigabytes (GB), 1 terabyte (TB), or higher per module (e.g., compared to 128 GB per dual in-line memory module (DIMM) in DDR3). The DDR4 SDRAM modules 50a-50n may operate at voltages of 1.2-1.35 volts (V) with a frequency between 800-2133 megahertz (MHz) (e.g., compared to 1.5-1.65V at frequencies between 400-1067 MHz in DDR3). In some embodiments, the memory modules 50a-50n may be implemented as low voltage DDR4 and operate at 1.05V. For example, the DDR4 SDRAM memory modules 50a-50n may implement 35% power savings compared to DDR3 memory. The DDR4 SDRAM memory modules 50a-50n may transfer data at speeds of 2.13-4.26 giga-transfers per second (GT/s) and higher (e.g., compared to 0.8-2.13 GT/s in DDR3). The operating parameters of the memory modules 50a-50n may be varied according to the design criteria of a particular implementation.

In an example, the memory modules 50a-50n may be compliant with the DDR4 specification entitled "DDR4 SDRAM", specification JESD79-4A, November 2013, published by the Joint Electron Device Engineering Council (JEDEC) Solid State Technology Association, Arlington, Va. Appropriate sections of the DDR4 specification are hereby incorporated by reference in their entirety.

The memory modules 50a-50n may be implemented as DDR4 LRDIMM or DDR4 registered dual in-line memory modules (RDIMM). The data buffers 90a-90n may allow the memory modules 50a-50n in a DDR4 LRDIMM configuration to operate at higher bandwidth and/or at higher capacities compared to DDR4 RDIMM (e.g., 1333 MT/s for DDR4 LRDIMM compared to 1067 MT/s for DDR4 RDIMM at 384 GB capacity). For example, compared to DDR4 RDIMM configurations, the DDR4 LRDIMM configuration of the memory modules 50a-50n may allow improved signal integrity on data signals, lower component latency through the data buffers 90a-90n and/or better intelligence and/or post-buffer awareness by the memory controller 20.

Figure 2:
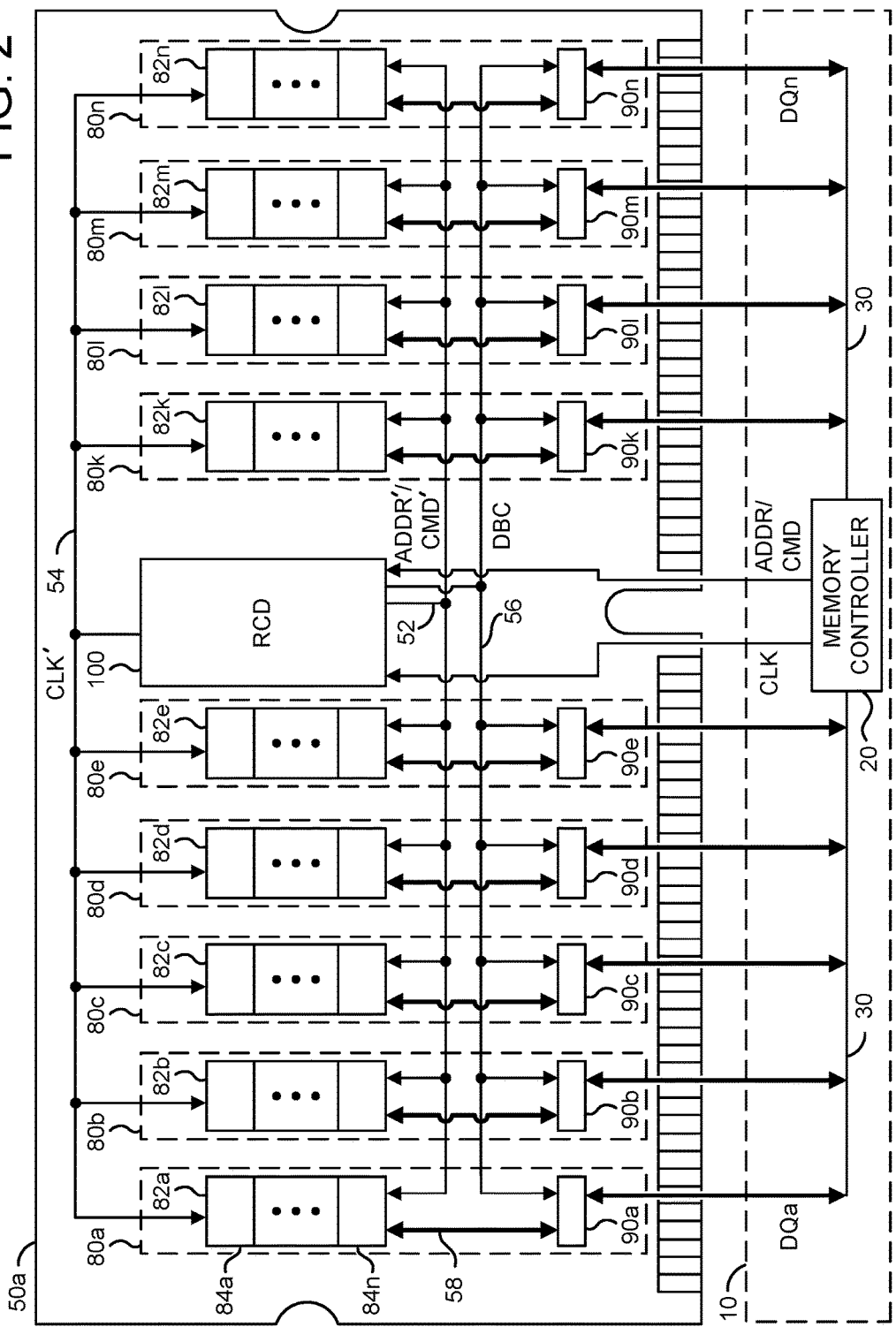
FIG. 2 is a diagram illustrating a memory module in which an embodiment of the invention is implemented.

Referring to FIG. 2, a block diagram is shown illustrating a memory module 50a in which an embodiment of the invention is implemented. The memory module 50a may be representative of the memory modules 50b-50n in FIG. 1. The memory module 50a is shown communicating with the memory controller 20. The memory controller 20 is shown as part of a block (or circuit) 10. The circuit 10 may be a motherboard, or other electronic component or computing engine that communicates with the memory module 50a.

The memory module 50a may comprise one or more blocks (or circuits) 80a-80n and/or the RCD circuit 100. The circuits 80a-80n may implement data paths of the memory module 50a. For example, the data path 80a may include the blocks 82a and/or the data buffer 90a. The data paths 80b-80n may have a similar implementations. The circuits 82a-82n may each be implemented as a memory channel. Each of the memory channels 82a-82n may comprise a number of blocks (or circuits) 84a-84n. The circuits 84a-84n may be implemented as random access memory (RAM) chips. For example, the RAM chips 84a-84n may implement a volatile memory such as dynamic RAM (DRAM). In some embodiments, the RAM chips 84a-84n may be physically located on both sides (e.g., the front and back) of the circuit board of the memory modules 50a-50n. A capacity of memory on the memory module 50a may be varied according to the design criteria of a particular implementation.

The memory controller 20 may generate a signal (e.g., CLK) and a number of control signals (e.g., ADDR/CMD). The signal CLK and/or the signals ADDR/CMD may be presented to the RCD circuit 100. A data bus 30 may be connected between the memory controller and the data paths 80a-80n. The memory controller 20 may generate and/or receive data signals (e.g., DQa-DQn) that may be presented/received from the data bus 30. The signals DQa-DQn may be presented to each of the data paths 80a-80n.

The RCD circuit 100 may be configured to communicate with the memory controller 20, the memory channels 82a-82n and/or the data buffers 90a-90n. The RCD circuit 100 may decode instructions received from the memory controller 20. For example, the RCD circuit 100 may receive register command words (RCWs). In another example, the RCD circuit 100 may receive buffer control words (BCWs). The RCD circuit 100 may be configured to train the DRAM chips 84a-84n, the data buffers 90a-90n and/or command and address lines between the memory controller 20 and the modules 50a-50n. For example, the RCWs may flow from the memory controller 20 to the RCD circuit 100. The RCWs may be used to configure the RCD circuit 100.

The RCD circuit 100 may be used in both LRDIMM and RDIMM configurations. The RCD circuit 100 may implement a 32-bit 1:2 command/address register. The RCD circuit 100 may support an at-speed bus (e.g., a BOOM bus between the RCD circuit 100 and the data buffers 90a-90n). The RCD circuit 100 may implement automatic impedance calibration. The RCD circuit 100 may implement command/address parity checking. The ROD circuit 100 may control register RCW readback. The RCD circuit 100 may implement a 1 MHz inter-integrated circuit ($I^2C$) bus (e.g., a serial bus). Inputs to the RCD circuit 100 may be pseudo-differential using external and/or internal voltages. The clock outputs, command/address outputs, control outputs and/or data buffer control outputs of the RCD circuit 100 may be enabled in groups and independently driven with different strengths.

The RCD circuit 100 may receive the signal CLK and/or the signals ADDR/CMD from the memory controller 20. Various digital logic components of the RCD circuit 100 may be used to generate signals based on the signal CLK and/or the signals ADDR/CMD and/or other signals (e.g., RCWs). The RCD circuit 100 may also be configured to generate a signal (e.g., CLK') and signals (e.g., ADDR'/CMD'). For example, the signal CLK' may be a signal Y_CLK in the DDR4 specification. The signal CLK' and/or the signals ADDR'/CMD' may be presented to each of the memory channels 82a-82n. For example, the signals CLK' and/or ADDR'/CMD' may be transmitted on a common bus 54. The RCD circuit 100 may generate one or more signals (e.g., DBC). The signals DBC may be presented to the data buffers 90a-90n. The signals DBC may be transmitted on a common bus 56 (e.g., a data buffer control bus).

The data buffers 90a-90n may be configured to receive data from the bus 56. The data buffers 90a-90n may be configured to generate/receive data to/from the bus 30. The bus 30 may comprise traces, pins and/or connections between the memory controller 20 and the data buffers 90a-90n. A bus 58 may carry the data between the data buffers 90a-90n and the memory channels 82a-82n. The data buffers 90a-90n may be configured to buffer data on the buses 30 and 58 for write operations (e.g., data transfers from the memory controller 20 to the corresponding memory channels 82a-82n). The data buffers 90a-90n may be configured to buffer data on the buses 30 and 58 for read operations (e.g., data transfers from the corresponding memory channels 82a-82n to the memory controller 20).

The DDR4 LRDIMM configuration may reduce a number of data loads to improve signal integrity on a data bus (e.g., the bus 30) of the memory module from a maximum of several (e.g., four) data loads down to a single data load. The distributed data buffers 90a-90n may allow DDR4 LRDIMM to implement shorter I/O trace lengths compared to DDR3 LRDIMM designs that use a centralized memory buffer. For example, shorter stubs connected to the memory channels 82a-82n may result in less pronounced signal reflections (e.g., improved signal integrity). In another example, the shorter traces may result in a reduction in latency (e.g., approximately 1.2 nanoseconds (ns), which is 50% less latency than DDR3 buffer memory). In yet another example, the shorter traces may reduce I/O bus turnaround time. For example, without the distributed data buffers 90a-90n (e.g., in some DDR3 memory applications) traces may be routed to a centrally located memory buffer, increasing trace lengths up to six inches compared to the DDR4 LRDIMM implementation shown in FIG. 2.

In some embodiments, the DDR4 LRDIMM configuration may implement nine of the data buffers 90a-90n. The memory modules 50a-50n may implement 2 millimeter (mm) frontside bus traces and backside traces (e.g., the connectors/pins/traces 60). A propagation delay through the data buffers 90a-90n may be 33% faster than through a DDR3 memory buffer (e.g., resulting in reduced latency). In some embodiments, the data buffers 90a-90n may be smaller (e.g., a reduced area parameter) than a data buffer used for DDR3 applications.

Figure 3:
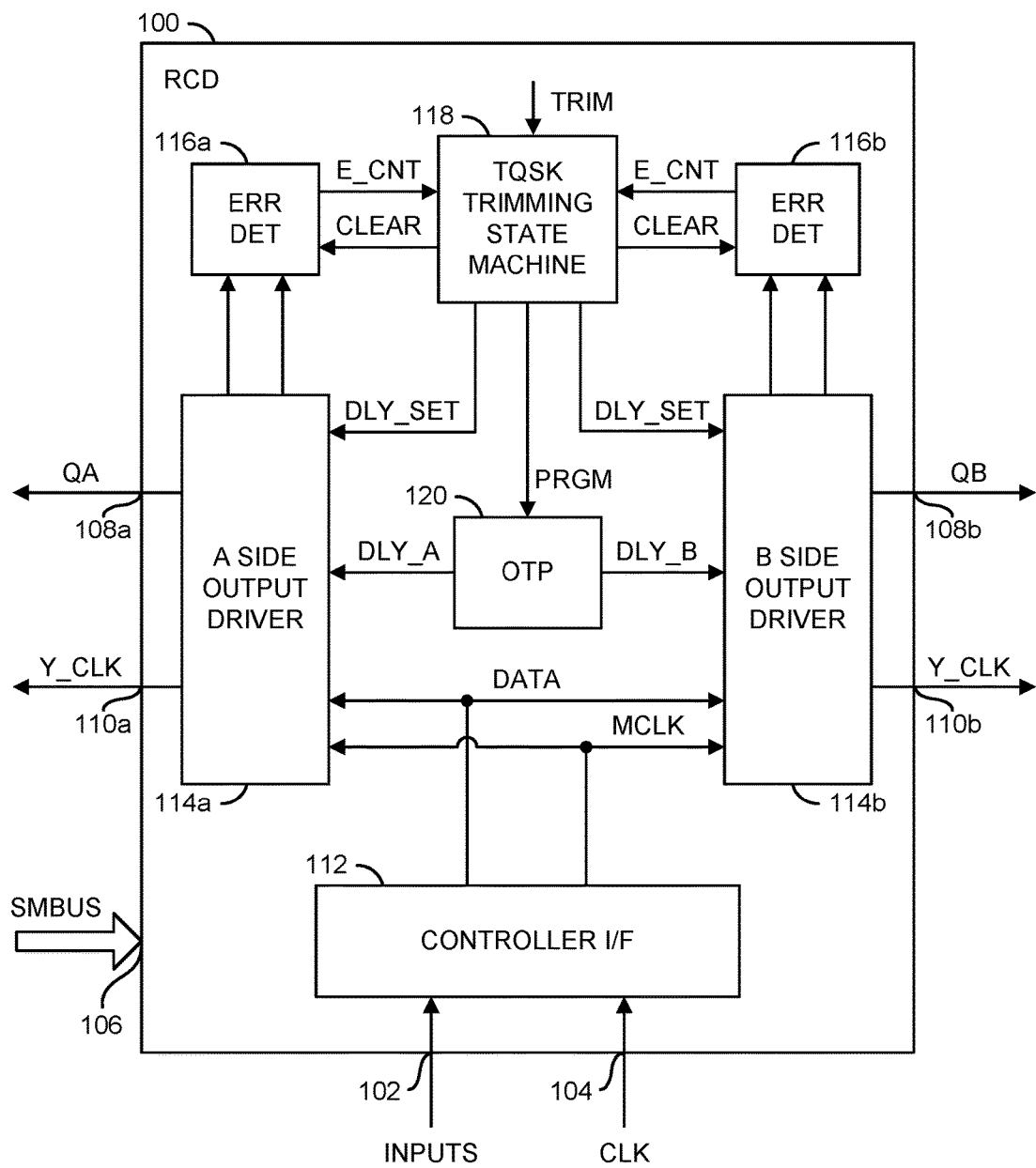
FIG. 3 is a diagram illustrating a registered clock driver in accordance with an embodiment of the invention.

Referring to FIG. 3, a diagram is shown illustrating a registered clock driver in accordance with an embodiment of the invention. In various embodiments, a circuit 100 may implement a registered clock driver circuit (or chip). In various embodiments, the circuit 100 may be JEDEC compliant (e.g., compliant with the DDR4 specification entitled "DDR4 SDRAM", specification JESD79-4A, November 2013, published by the Joint Electron Device Engineering Council (JEDEC) Solid State Technology Association, Arlington, Va.). In various embodiments, the circuit 100 is enable to automatically adjust a skew time of a plurality of output pins during a manufacturing test operation. In various embodiments, the circuit 100 is enabled to adjust the skew time (e.g., tSkew) to within a single gate delay of a reference output clock. As used herein, the term tSkew is defined as the phase difference between an output data signal or pin (e.g., Q) and an output clock signal or pin (e.g., Y_CLK). In an example, a DDR4 registered clock driver (RCD) may have sixty-six output pins. However, other numbers of output pins may be implemented to meet the design criteria of a particular implementation. The circuit 100 may be configured to adjust the phase of the sixty-six output pins relative to the clock signal Y_CLK (or to respective copies of the clock signal Y_CLK) to meet manufacturer specifications (e.g., within +/−50 ps, etc.). The granularity of the phase adjustment is generally determined by delay elements within the circuit 100. During production testing, the circuit 100 may be configured to perform a trimming process in response to signals from automated test equipment and provide a pass/fail indication to the automated test equipment. In various embodiments, the circuit 100 may be utilized to implement the RCD in DDR4 RDIMM, DDR4 LRDIMM, and/or DDR4 UDIMM memory modules.

The circuit 100 may have an input 102 that receives input data (e.g., INPUTS), an input 104 that receives a clock signal (e.g., CLK), an input 106 that may receive control information (e.g., SMBUS), outputs 108a and 108b that may provide data outputs (e.g., QA and QB, respectively) and outputs 110a and 110b that may provide output clock signals (e.g., Y_CLK). The signals INPUTS and CLK may be received from a memory controller (e.g., the memory controller 20 in FIG. 1) via a memory bus of a motherboard. In an example, the signals INPUTS may be pseudo-differential using an external or internal voltage reference. The signals INPUTS may comprise the addr/cmd signals of FIGS. 1 and 2. In an example, the signal CLK may be implemented as differential clock signals CLK_t (true) and CLK_c (complement). The signals QA, QB and Y_CLK may be presented to a number of memory chips (e.g., 84a-84n in FIG. 2). For example, the signals QA, QB and Y_CLK may implement an output address and control bus for a DDR4 RDIMM, DDR4 LRDIMM, or DDR4 UDIMM memory module. The signal SMBUS may be implemented as an inter-integrated circuit ($I^2C$) bus. During a manufacturing test operation, the signal/bus SMBUS may be used to communicate test instructions from automatic test equipment (ATE) to the circuit 100 and the signals INPUTS and CLK may be used to communicate test data and clock to the circuit 100.

In various embodiments the circuit 100 may comprise a block 112, a block (or circuit) 114a, a block (or circuit) 114b, a block (or circuit) 116a, a block (or circuit) 116b, a block (or circuit) 118 and a block (or circuit) 120. The block 112 may implement a controller interface. The blocks 114a and 114b may implement output driver circuits. The blocks 116a and 116b may implement error detection circuits. The block 118 may implement a skew trimming state machine. The block 120 may be implemented as a one-time programmable memory device. In some embodiments, the blocks 114a and 114b and the blocks 116a and 116b may be combined as single circuits 114 and 116, respectively.

The block 112 may be configured to generate a data signal (e.g., DATA) and a clock signal (e.g., MCLK). The signals DATA and MCLK may be presented to the blocks 114a and 114b. In various embodiments, the signal DATA may be coupled to the blocks 114a and 114b by combinatorial logic (not shown). The blocks 114a and 114b may be configured to generate the signals QA, QB and Y_CLK. The block 114a may be connected to the block 116a. The blocks 116a and 116b may be configured to generate a signal E_CNT and receive a signal CLEAR. The signal E_CNT may indicate failure of an output signal path of the block 114a and/or an output signal path of the block 114b to meet predetermined timing and/or phase criteria. The signal CLEAR may be used to reset the signal E_CNT between iterations of a trimming process in accordance with an embodiment of the invention.

The signal E_CNT may be presented to the block 118. The block 118 may be configured to generate the signal CLEAR and a signal DLY_SET. The signal DLY_SET may comprise a control signal that may be presented to a control input of the blocks 114a and 114b. The signal DLY_SET may be used to control a respective delay used by each of the blocks 114a and 114b to generate the signals QA and QB, respectively. The block 118 may also present one or more control signals (e.g., PRGM) to the block 120. The one or more control signals PRGM may be utilized to program the delay values determined during the trimming process into the block 120. In various embodiments, the block 120 may be implemented as a one-time programmable (OTP) memory. In various embodiments, the block 120 may be implemented using antifuses. However, other types of nonvolatile memory cells (e.g., programmable fuse, EPROM, flash, etc.) may be used to implement the block 120. The block 120 may present a first control signal (e.g., DLY_A) to the block 114a and a second control signal (e.g., DLY_B) to the block 114b. During normal operation, the control signals DLY_A and DLY_B are generally configured to set output delays of each output pin of the chip 100 to values determined during the trimming process. In an example, the signal DLY_SET may be presented during production testing to the same inputs that receive the signals DLY_A and DLY_B.

Figure 4:
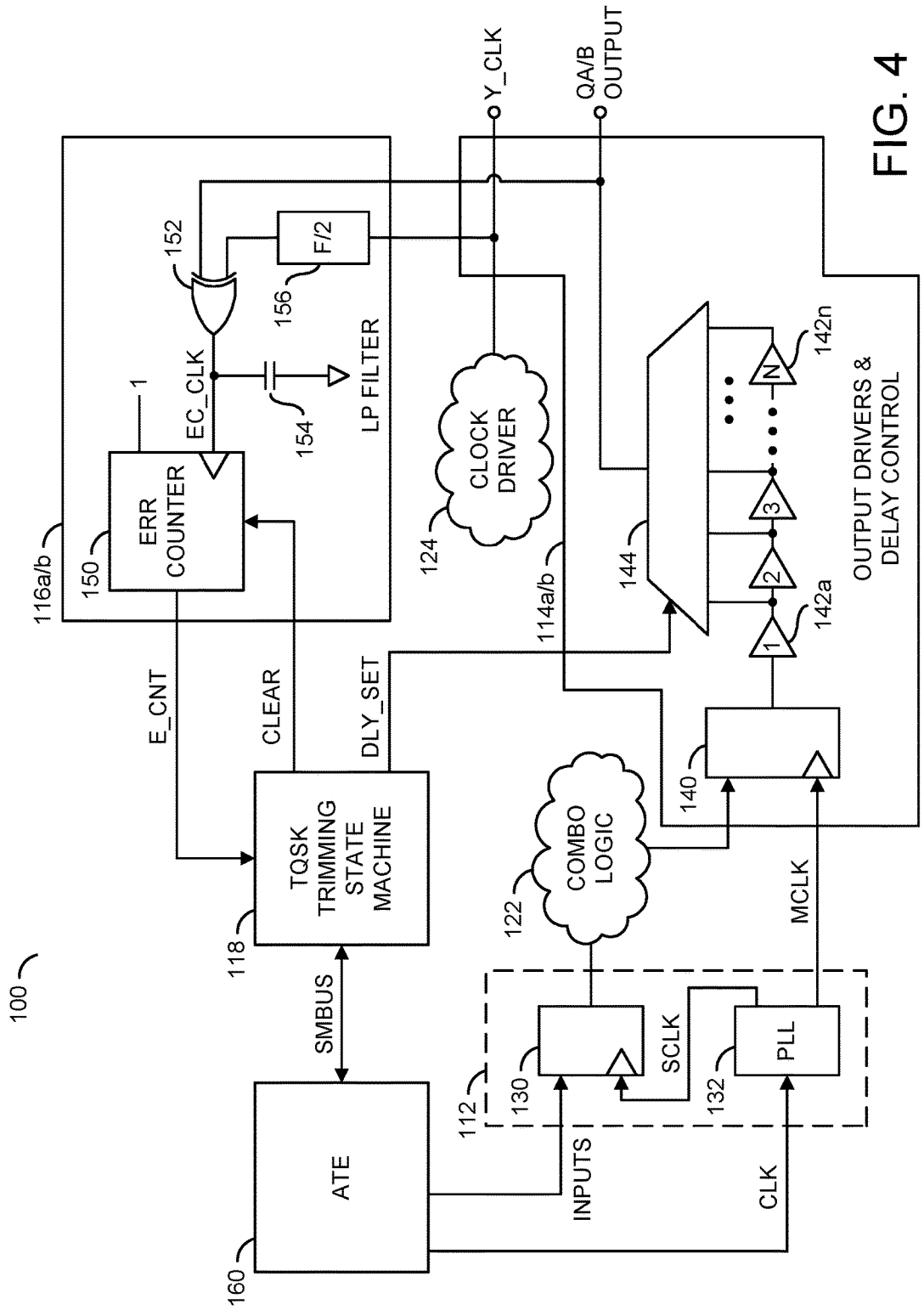
FIG. 4 is a more detailed diagram of the registered clock driver of FIG. 3.

Referring to FIG. 4, a more detailed diagram is shown illustrating an example output driver circuit of the registered clock driver 100 of FIG. 3 implemented in accordance with an embodiment of the invention. In an example, the controller interface 112 may comprise a block (or circuit) 130 and a block (or circuit) 132. The block 130 may be configured to latch the signals INPUTS in response to a clock signal (e.g., SCLK). The block 132 may be implemented as a phase locked loop (PLL) or other equivalent circuit. The circuit 132 may be configured to generate the signal SCLK and the signal MCLK in response to the input clock signal CLK. The block 130 may present the latched version of the signals INPUTS to combinatorial logic 122 of the circuit 100. The combinatorial logic 122 may present outputs generated in response to the latched version of the signals INPUTS to the circuits 114a and 114b. The signal MCLK may also be presented to the circuits 114a and 114b. A clock driver logic 124 may be configured to generate the signal Y_CLK.

In various embodiments, the circuit 114a and 114b may comprise a block (or circuit) 140, a number of blocks (or circuits) 142a-142n, and a block (or circuit) 144. The block 140 may be implemented as a latch or register. The blocks 142a-142n may implement a plurality of delay elements. The blocks 142a-142n may be connected in series to produce a multi-tap delay line. The block 144 may be implemented as a multiplexer circuit. The block 144 may have (i) a number of inputs that may be connected to outputs of the blocks 142a-142n, a control input that may receive a signal DLY_SET, and an output that may present an output signal QA/B. The output signal QA/B generically represents the output signals QA and QB in FIG. 3. However, in other embodiments other types of programmable delay elements and/or lines may be implemented in place of the blocks 142a-142n and 144.

The blocks 116a and 116b may comprise a block (or circuit) 150, a block (or circuit) 152, a block (or circuit) 154, and a block (or circuit) 156. The block 150 may be implemented as an error counter. The block 152 may be implemented as a logic circuit. In an example, the block 152 is implemented as an Exclusive-OR (XOR) gate. The block 154 may implement a low pass filter. The block 156 may implement a frequency divider. In an example, the block 156 is configured to divide a clock signal frequency by two. The block 150 may have an output that may present the signal E_CNT, an input that may receive the signal CLEAR, an input that may be tied to a logic HIGH, or "1", and an input that may receive a signal EC_CLK. The block 152 may have an output that presents the signal EC_CLK, an input that receives the signal QA/B and an input that receives an output of the block 156. The block 154 may be connected between the output of the block 152 and a circuit ground potential. The block 156 may have an input that may receive the output clock signal Y_CLK.

The trimming state machine 118 may be configured to search and select a tPD edge, through the multiplexer 144, that is closest to the output clock Y_CLK. The comparison of output signal Q and the output clock signal Y_CLK is done by the XOR gate 152. If the phases of the inputs are different, pulses are generated at the output of XOR gate 152. The pulses may be used to clock the counter 150, which is cleared before every search. The low pass filter 154 may be used at the output of the XOR gate 152 to ensure that when the phases of the two inputs are close enough (e.g., within +/−50 ps, etc.), there is no pulse to the clock input of the counter 150, which indicates the trimming is successful. At end of the trimming process, the delay settings (e.g., the control values of the multiplexers 144) for all Q outputs are programmed into the one-time programmable (OTP) memory 120.

The search and determination of the best delay settings is done through the state machine 118, which is controlled by the automated test equipment (ATE) 160 during production testing. In the example of a DDR4 RCD, the control of the state machine 118 is through the signal(s) SMBUS. During the production test, the ATE 160 presents test data and clocks using the signals INPUTS and CLK to the appropriate pins of the device under test (DUT).

An example procedures of tSkew trimming may be performed as follows:
 a) Power up a device under test (DUT);
 b) Drive the input clock signal CLK at a predetermined frequency (e.g. 1333 MHz) and the input signals INPUTS with an alternating data pattern (e.g., 0x55, 0xaa, etc.) at half the frequency of the input clock signal CLK;
 c) Send a trimming command (e.g., TRIM) to the block 118 (e.g., through SMBUS);
 d) Wait for trimming to complete (e.g., by delaying a fixed amount of time or a predetermined number of clock cycles, or by reading a register);
 e) Read a tQSK "status register"—pass or fail;
 f) If search fails in the entire multiplexer range—bin the device under test as a reject;
 g) If the search succeeds, read a tQSK "result register," which contains all multiplexer trim settings for all Q output pins;
 h) Program the multiplexer trim settings for all output pins to the OTP memory 120;
 i) Read back the trim bits from the OTP memory 120 to confirm whether the OTP memory 120 is programmed correctly;
 j) If the OTP memory 120 is programmed correctly, bin the device under test as a pass; and
 k) Otherwise bin the device under test as a reject.

The status and result registers (not shown) are generally controlled by the trimming state machine 118 with actions such as clear, write, etc. In various embodiments, the status and result registers may be implemented as part of the trimming state machine 118, an aggregate of the error counter circuits 150, or other implementations, as long as the status and result registers are logically controlled by the trimming state machine 118.

The trimming state machine 118 determines whether the particular part passes or fails. In an example, the trimming state machine 118 notifies the ATE 160 about the pass or fail status of the device under test by setting the status register based upon the trimming results. At the end of trimming (e.g., after a predetermined amount of time, a predetermined number of clock cycles, etc.), the ATE 160 reads the status register to determine whether the device under test passes or fails. For example, the device under test may be regarded as a reject if either an appropriate delay could not be found or the read back of the OTP memory 120 showed a mismatch. For example, a read failure of the OTP memory 120 might result from a manufacturing defect in OTP cells and/or related circuits. In general, an OTP read failure rate should be very low. Although the method in accordance with an example embodiment of the invention is illustrated in connection with a DDR4 RCD, the method may also be used to optimize tSkew in other similar applications.

Figure 5:
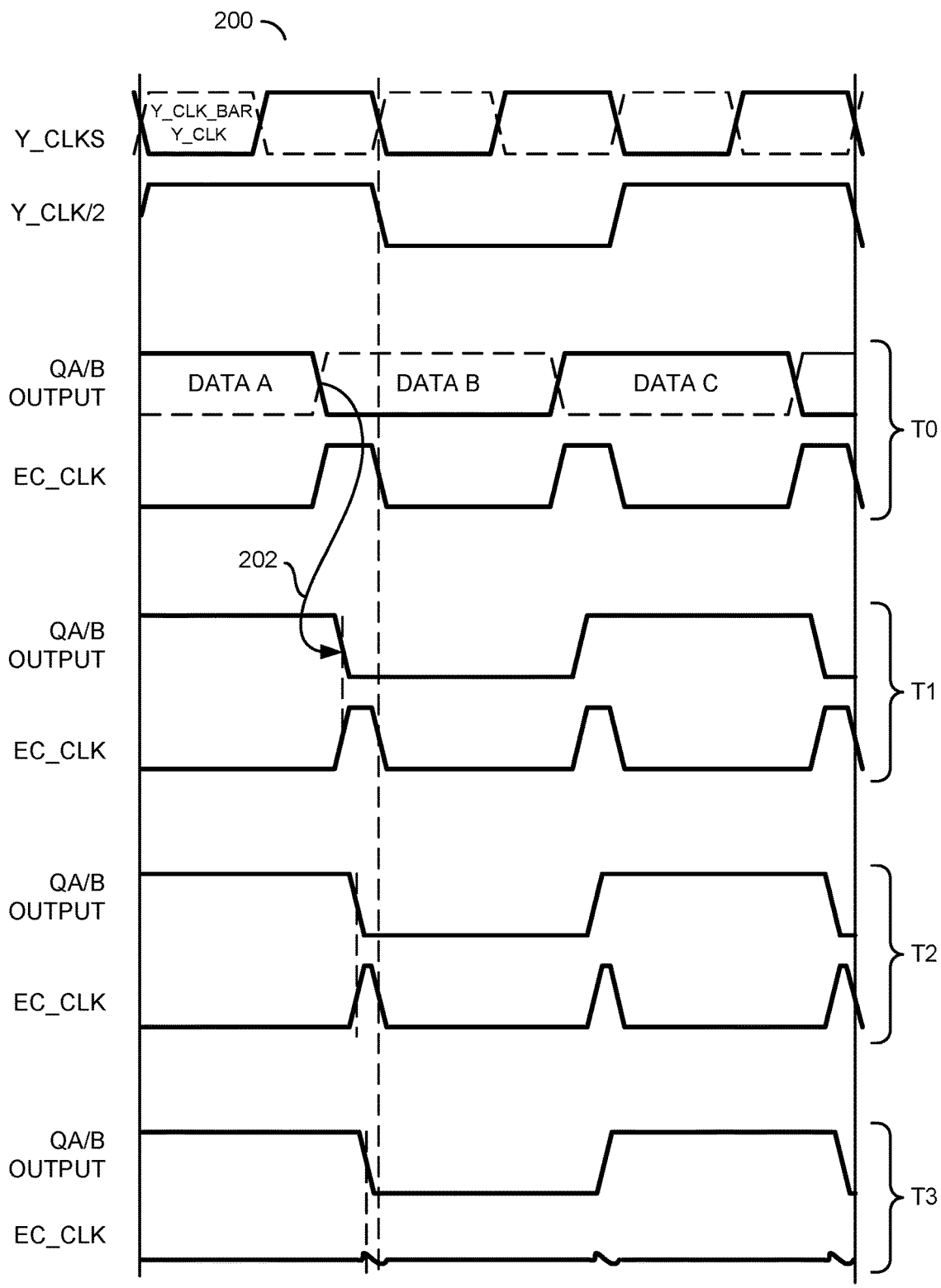
FIG. 5 is a timing diagram illustrating operation of an example embodiment of the invention.

Referring to FIG. 5, a timing diagram 200 is shown illustrating an output skew adjustment operation in accordance with an example embodiment of the invention. The timing diagram 200 generally illustrates a number of adjustment steps performed in adjusting a phase difference between an example output signal (e.g., QA/B) and the output clock signal Y_CLK. The steps illustrated in the timing diagram 200 are generally controlled by the block 118 of FIG. 3. In a number of steps T0 to T3, the block 118 may adjust a delay in the output driver circuit to shift a data signal transition to minimize a phase difference between the output signal QA/B and the output clock signal Y_CLK. A first shift in the transition of the output signal QA/B is illustrated by an arrow 202. The block 118 generally increases the delay in the respective output driver circuit until either (i) an error signal (e.g., E_CNT) is eliminated (e.g., no longer asserted) or (ii) the delay (e.g., DLY_SET) reaches a maximum value without eliminating the error signal E_CNT. The process illustrated in FIG. 5 is performed during production testing for each output pin of the registered clock driver circuit 100, either in parallel or serially.

Figure 6:
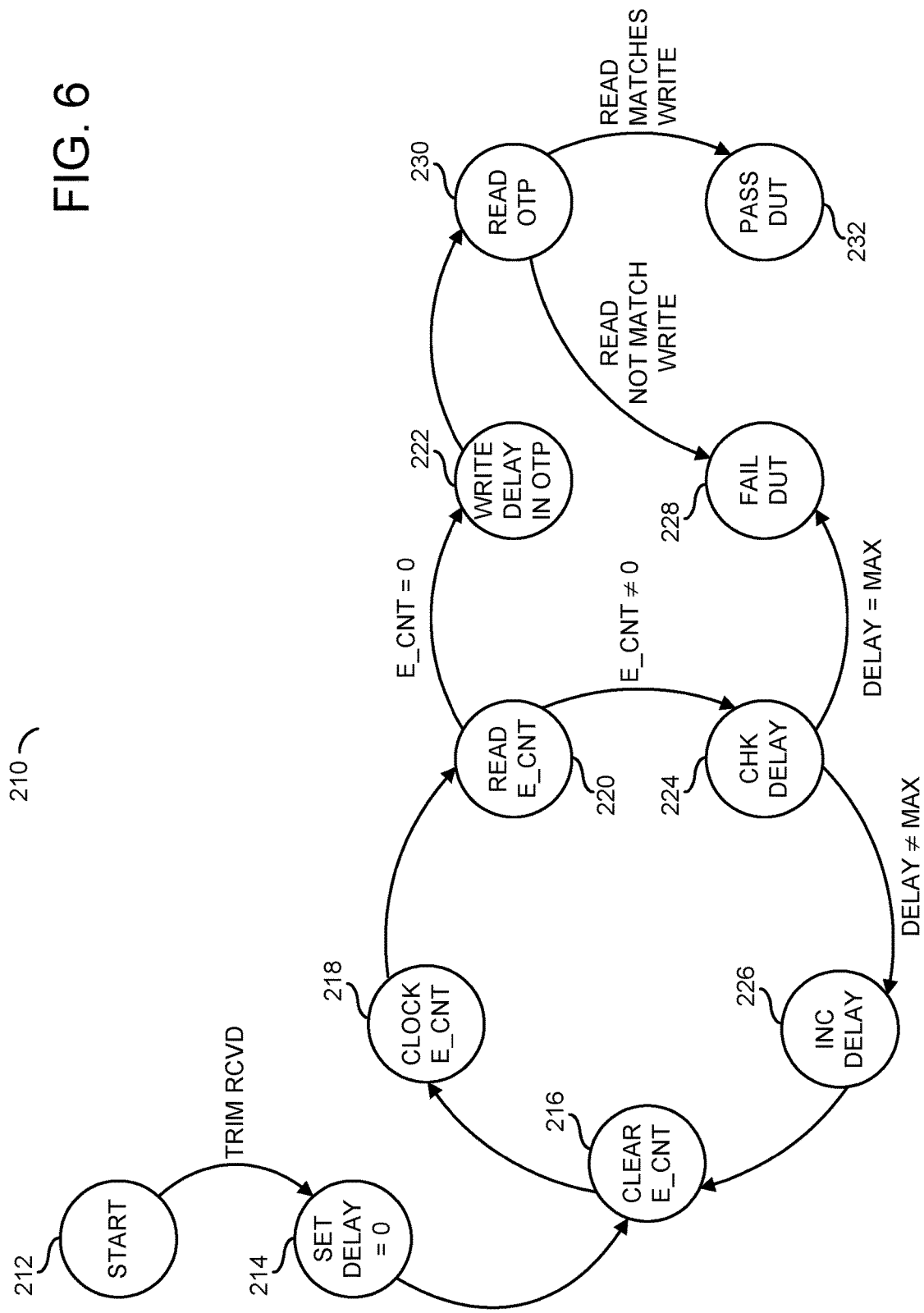
FIG. 6 is a state diagram illustrating an example implementation of a trimming state machine in accordance with an embodiment of the invention.

Referring to FIG. 6, a state diagram 210 is shown illustrating an example implementation of a trimming state machine in accordance with an example embodiment of the invention. In various embodiments, the trimming state machine 118 may be implemented as a finite state machine (e.g., a micro-controller, sequencer, etc.). The trimming state machine 118 may implement a step (or state) 212, a step (or state) 214, a step (or state) 216, a step (or state) 218, a step (or state) 220, a step (or state) 222, a step (or state) 224, a step (or state) 226, a step (or state) 228, a step (or state) 230, and a step (or state) 232. When a device under test is powered up, the trimming state machine 118 starts in the state 212 and awaits a TRIM command. When the TRIM command is received, the trimming state machine 118 moves to the state 214. In the state 214, the trimming state machine 118 sets a delay of an output pin to zero (e.g., the signal DLY_SET is initialized with a value of 0). The trimming state machine 118 then moves to the state 216.

In the state 216, the trimming state machine 118 clears (or resets) the error count E_CNT (e.g., by asserting the signal CLEAR) and moves to the state 218. In the state 218, the trimming state machine 118 allows a number of clock cycles to pass to allow accumulation of the error count E_CNT with the clock pulses as a result of skew. When the number of clock cycles has passed, the trimming state machine 118 moves to the state 220. In the state 220, the trimming state machine 118 reads the error count E_CNT. If the skew is sufficiently small, the error count E_CNT will remain cleared (e.g., has a value of 0). When the error count E_CNT has remained cleared, the trimming state machine 118 moves to the state 222. In the state 222, the trimming state machine 118 writes the delay that resulted in no error count (e.g., the current value of the signal DLY_SET) to the one time programmable (OTP) memory 120.

When the error count E_CNT has become non-zero (e.g., has a value other than 0), the trimming state machine 118 moves to the state 224. In the state 224, the trimming state machine 118 checks whether the delay is at a maximum value. When the delay is not at the maximum value, the trimming state machine 118 moves to the state 226 and increments the delay (e.g., increases the value of the signal DLY_SET by a predefined amount). Once the delay has been incremented, the trimming state machine 118 moves back to the state 216 to test the new delay. When the delay has reached the maximum value, the trimming state machine 118 moves to the state 228. In the state 228, the trimming state machine 118 sets an indication (e.g., a bit, a flag. a register value, etc.) to inform the automatic test equipment (ATE) that the device under test fails to meet the tSkew specification.

After the delay value(s) has(have) been written to the OTP memory in the state 222, the trimming state machine 118 moves to the state 230. In the state 230, the trimming state machine 118 reads the OTP memory and compares the retrieved value(s) to the value(s) written in the state 222. When the retrieved delay value(s) and the written delay value(s) match, the trimming state machine 118 moves to the state 232. In the state 232, the trimming state machine 118 sets an indication (e.g., a bit, a flag. a register value, etc.) to inform the automatic test equipment (ATE) that the device under test meets (passes) the tSkew specification. When the retrieved delay value(s) and the written delay value(s) do not match, the trimming state machine 118 moves to the state 228 and sets the indication (e.g., a bit, a flag. a register value, etc.) to inform the automatic test equipment (ATE) that the device under test has failed (e.g., due to a memory failure).

Figure 7:
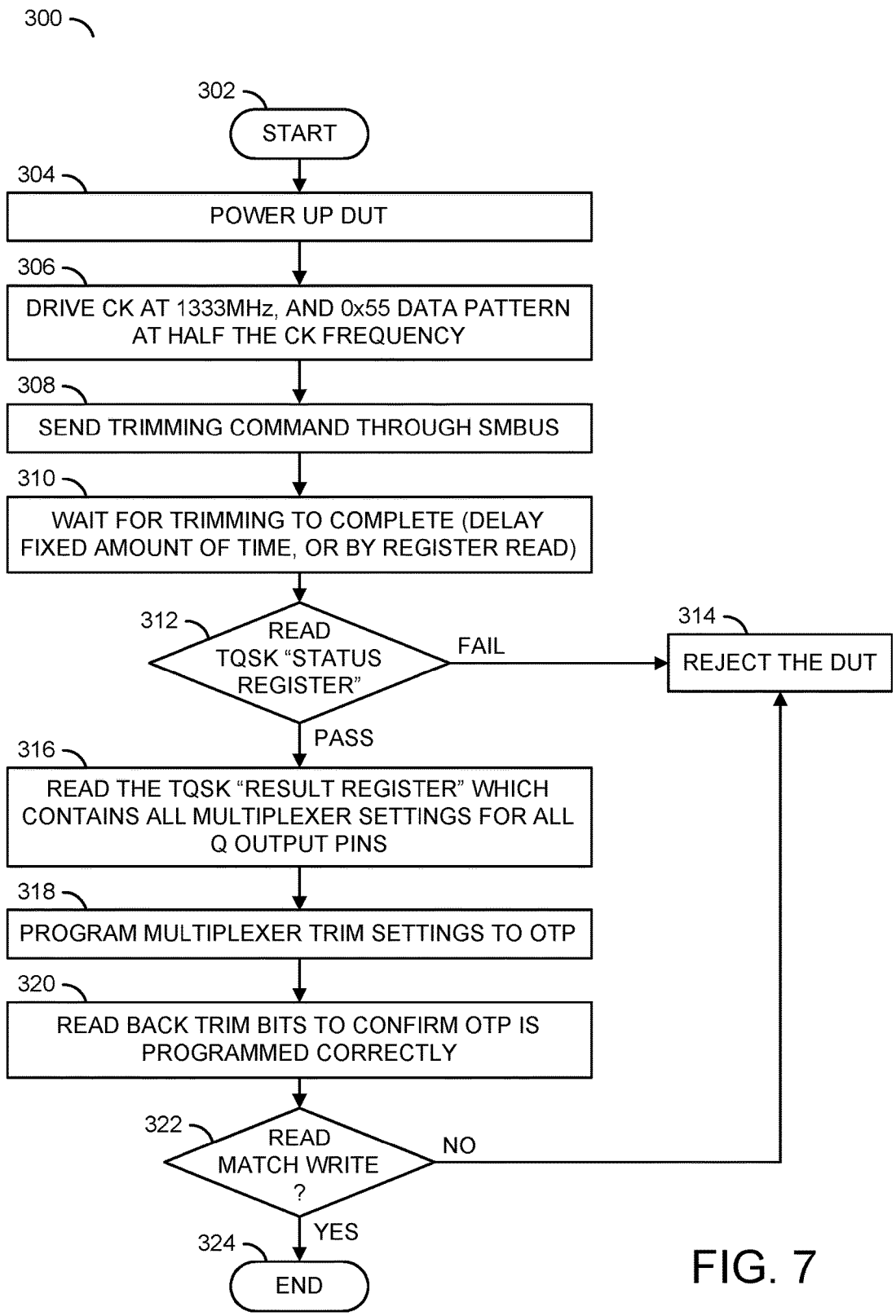
FIG. 7 is a flow diagram illustrating a process in accordance with an embodiment of the invention.

Referring to FIG. 7, a flow diagram illustrating a process in accordance with an embodiment of the invention. In various embodiments, a process 300 may be implemented to adjust the output skew timing of a registered clock driver. The process (or method) 300 may comprise a step (or state) 302, a step (or state) 304, a step (or state) 306, a step (or state) 308, a step (or state) 310, a step (or state) 312, a step (or state) 314, a step (or state) 316, a step (or state) 318, a step (or state) 320 and a step (or state) 322. The process 300 generally starts in the step 302 and moves to the step 304. In the step 304, the process 300 powers up a device incorporating the invention for testing by automatic test equipment (ATE) connected to the device. In the step 306, the process 300 begins driving the device under test with (i) a predetermined test clock signal (e.g., 1333 MHz) and (ii) a predetermined data pattern (e.g., 0x55, 0xaa, etc.) at half the clock frequency. In the step 308, the automatic test equipment sends a trimming command (e.g., TRIM) to the device under test (e.g., via the signals SMBUS). In the step 310, the process 300 waits for the trimming process to be completed. For example, the process 300 may implement a delay comprising a fixed amount of time or a number of clock cycles. In some embodiments, the process 300 may read a register to determine when the trimming is completed.

When the trimming operation is completed, the process 300 moves to the step 312. In the step 312, the process 300 may read a status register to determine whether the device has passed or failed (e.g., met or missed predetermined timing criteria, respectively). When the status register shows the device failed to meet the predetermined timing criteria, the process 300 moves to the step 314 where the device under test is rejected. When the status register shows the device under test met the timing criteria, the process 300 moves to the step 316. In the step 316, the process 300 reads a result register which contains the settings for all of the Q output pins that resulted in the device passing. In the step 318, the process 300 programs the values from the result register into the one-time programmable memory. In the step 320, the process 300 reads back the values stored in the one time programmable memory to ensure that the memory has been programmed correctly. When the values read back from the one time programmable memory do not match the values written, the process 300 moves to the step 314 where the device under test is rejected. Otherwise, the process 300 moves to the step 322 and terminates.

Embodiments of the invention generally provide a design for testability (DFT)/design for manufacturing (DFM) method to optimize an output skew timing of an integrated circuit (IC) to guarantee each unit shipped meets tSkew specification with best possible margin. The method in accordance with an embodiment of the invention improves yield and resolves test errors due to limitations on accuracy of test equipment. By ensuring sufficient margin to account for FAB and assembly process variations, low test yields may be eliminated. In various embodiments, tSkew of every pin may be aligned to center of the specification during manufacturing test, so that yield may be maximized as impacts of process variations are eliminated. Embodiments of the invention may solve two problems: (i) accuracy issues due to limitations of test equipment accuracy and (ii) yield problems due to either lack of design margins and/or variations in chip manufacturing process. In various embodiments, tSkew numbers requested by customers may be guaranteed with margin, possibly providing a competitive advantage architecturally.

The functions and structures illustrated in the diagrams of FIGS. 1 to 7 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

Embodiments of the present invention may also be implemented in one or more of ASICs (application specific integrated circuits), FPGAs (field programmable gate arrays), PLDs (programmable logic devices), CPLDs (complex programmable logic device), sea-of-gates, ASSPs (application specific standard products), and integrated circuits. The circuitry may be implemented based on one or more hardware description languages. Embodiments of the present invention may be utilized in connection with flash memory, nonvolatile memory, random access memory, read-only memory, magnetic disks, floppy disks, optical disks such as DVDs and DVD RAM, magneto-optical disks and/or distributed storage systems.

Although embodiments of the invention have been described in the context of a DDR4 application, the present invention is not limited to DDR4 applications, but may also be applied in other high data rate digital communication applications where different transmission line effects, cross-coupling effects, traveling wave distortions, phase changes, impedance mismatches and/or line imbalances may exist. The present invention addresses concerns related to high speed communications, flexible clocking structures, specified command sets and lossy transmission lines. Future generations of DDR can be expected to provide increasing speed, more flexibility, additional commands and different propagation characteristics. The present invention may also be applicable to memory systems implemented in compliance with either existing (legacy) memory specifications or future memory specifications.

While the invention has been particularly shown and described with reference to the preferred embodiments thereof, it will be understood by those skilled in the art that various changes in form and details may be made without departing from the scope of the invention.

The invention claimed is:

1. An apparatus comprising:
   an output driver circuit configured to (i) receive a data input signal, an input clock signal, and a first control signal and (ii) generate a data output signal and an output clock signal, wherein said data output signal is a delayed version of said data input signal and a length of delay between said data input signal and said data output signal is determined in response to said first control signal; and
   a trimming circuit configured to be enabled during production testing by a command received by said apparatus from automated test equipment and to generate said first control signal in response to a second control signal, wherein said data input signal is generated during said production testing in response to a test pattern and a test clock received by said apparatus from said automated test equipment and said trimming circuit is enabled to (i) vary a value of said first control signal to minimize a phase difference between said data output signal and said output clock signal, (ii) determine whether the apparatus passes or fails said production test based upon a trimming result, and (iii) notify the automated test equipment about the pass or fail status of the apparatus under test.

2. The apparatus according to claim 1, wherein said data output signal drives a line of an output address and command bus connected to a plurality of memory chips of a double data rate (DDR) memory module.

3. The apparatus according to claim 2, wherein said DDR memory module comprises a double data rate fourth generation (DDR4) dual in-line memory module (DIMM).

4. The apparatus according to claim 1, wherein said trimming circuit is further configured to:
   determine whether the phase difference between said data output signal and said output clock signal meets a predefined criteria;
   store said value of said first control signal in a one time programmable memory when said phase difference meets the predefined criteria; and
   indicate a failure condition when said phase difference does not meet the predefined criteria.

5. The apparatus according to claim 4, wherein the predefined criteria comprise a double data rate fourth generation (DDR4) output address and control bus output skew timing specification.

6. The apparatus according to claim 4, wherein the predefined criteria comprise an output skew within +/−50 picoseconds.

7. The apparatus according to claim 1, wherein said trimming circuit comprises a state machine configured to vary the value of said first control signal to minimize said phase difference between said data output signal and said output clock signal to within a single gate delay of said output clock signal.

8. The apparatus according to claim 1, wherein said output driver circuit comprises a programmable delay line configured to vary the length of delay between said data input signal and said data output signal in response to said first control signal.

9. The apparatus according to claim 8, wherein said programmable delay line comprises:
   a plurality of delay stages connected in series; and
   a multiplexer connected to said plurality of delay stages and controlled by said first control signal.

10. The apparatus according to claim 1, further comprising an error detection circuit configured to generate an error count in response to said data output signal and said data output clock signal having a phase difference greater than a predetermine value, wherein said trimming circuit is further configured to read the error count in one state and clear the error count in another state.

11. The apparatus according to claim 10, wherein said error detection circuit comprises a register configured to load a predetermined value in response to a logical combination of said data output signal and said output clock signal.

12. The apparatus according to claim 1, wherein said trimming circuit is further configured to minimize a phase difference between a plurality of data output signals and said output clock signal.

13. The apparatus according to claim 1, wherein said apparatus is part of a registered clock driver.

14. The apparatus according to claim 1, wherein said trimming circuit is configured to notify said automated test equipment about the pass or fail status of the apparatus by setting a status register based upon the trimming results.

15. A method of adjusting output skew timing of an output driver circuit comprising the steps of:
- enabling a trimming circuit generate a first control signal during production testing in response to a command received from automated test equipment;
- generating a data input signal to said driver circuit during said production testing in response to a test pattern and a test clock received from said automated test equipment;
- generating a data output signal and an output clock signal using said output driver circuit, wherein said data output signal is a delayed version of said data input signal and a length of delay is determined in response to said first control signal;
- varying a value of said first control signal until a phase difference between said data output signal and said output clock signal is minimized;
- determining whether the output driver circuit passes or fails said production test based upon a trimming result; and
- notifying the automated test equipment about the pass or fail status of the output driver circuit under test.

16. The method according to claim 15, further comprising:
- determining whether the phase difference meets a predefined criteria;
- when the phase difference meets the predefined criteria, storing said value in a memory; and
- when the phase difference does not meet the predefined criteria, indicating a failure condition.

17. The method according to claim 16, wherein the predefined criteria comprise a double data rate fourth generation (DDR4) output address and control bus output skew specification.

18. The method according to claim 17, wherein the predefined criteria comprise an output skew within +/−50 picoseconds.

19. The method according to claim 15, wherein
said trimming circuit is configured to notify said automated test equipment about the pass or fail status of the apparatus by setting a status register based upon the trimming results.

20. An apparatus comprising:
- means for (i) receiving a data input signal, an input clock signal, and a first control signal and (ii) generating an output clock signal and data output signal, wherein said data output signal is a delayed version of said data input signal and a length of delay between said data input signal and said data output signal is determined in response to said first control signal; and
- means for generating said first control signal in response to a second control signal, wherein (i) said data input signal is generated during a production testing in response to a test pattern and a test clock received by said apparatus from automated test equipment and (ii) said means for generating said first control signal is configured to be enabled during said production testing by a command received by said apparatus from said automated test equipment, and to vary a value of said first control signal to minimize a phase difference between said data output signal and said output clock signal, to determine whether the apparatus passes or fails said production test based upon a trimming result, and to notify said automated test equipment about the pass or fail status of the apparatus under test.

* * * * *